(12) United States Patent
Kim

(10) Patent No.: US 10,503,588 B2
(45) Date of Patent: Dec. 10, 2019

(54) MEMORY SYSTEMS INCLUDING MEMORY CONTROLLERS AND MEMORY MODULES AND METHODS OF PROCESSING DATA IN THE MEMORY SYSTEMS

(71) Applicant: SK hynix Inc., Icheon-si, Gyeonggi-do (KR)

(72) Inventor: Du Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 43 days.

(21) Appl. No.: 15/962,842

(22) Filed: Apr. 25, 2018

(65) Prior Publication Data

US 2019/0155685 A1 May 23, 2019

(30) Foreign Application Priority Data

Nov. 20, 2017 (KR) ........................ 10-2017-0155180

(51) Int. Cl.
*G11C 29/00* (2006.01)
*G06F 11/10* (2006.01)
*G11C 29/52* (2006.01)
*G11C 5/04* (2006.01)

(52) U.S. Cl.
CPC .......... *G06F 11/1068* (2013.01); *G11C 29/52* (2013.01); *G11C 5/04* (2013.01)

(58) Field of Classification Search
None
See application file for complete search history.

(56) References Cited

U.S. PATENT DOCUMENTS

| 2006/0132822 | A1* | 6/2006 | Walmsley | G06F 12/1408 |
| | | | | 358/1.14 |
| 2012/0324310 | A1* | 12/2012 | Oshida | H04L 9/3278 |
| | | | | 714/755 |
| 2014/0229790 | A1* | 8/2014 | Goss | G06F 11/1048 |
| | | | | 714/755 |
| 2015/0254129 | A1* | 9/2015 | Authement | G06F 11/1048 |
| | | | | 714/704 |
| 2015/0278016 | A1* | 10/2015 | La Fetra | H04L 1/0045 |
| | | | | 714/766 |
| 2016/0110252 | A1* | 4/2016 | Hyun | G11C 29/52 |
| | | | | 714/766 |
| 2018/0278273 | A1* | 9/2018 | Kifune | H03M 13/2927 |
| 2019/0129656 | A1* | 5/2019 | Bains | G06F 3/0659 |

FOREIGN PATENT DOCUMENTS

KR 20120103276 A 9/2012

* cited by examiner

*Primary Examiner* — Mujtaba M Chaudry
(74) *Attorney, Agent, or Firm* — William Park & Associates Ltd.

(57) ABSTRACT

A memory system includes a memory medium configured to store memory data and a media error correction code (ECC) decoder coupled to the memory medium. The media ECC decoder is configured to receive encoded read data from the memory medium, wherein the encoded read data is read from the stored memory data. The media ECC decoder is further configured to decode the encoded read data when the encoded read data is not poison data and a number of erroneous bits for the encoded read data is less than or equal to a threshold value. The media ECC decoder is also configured to skip decoding the encoded read data when the encoded read data is poison data and the number of erroneous bits for the encoded read data is less than or equal to the threshold value.

37 Claims, 9 Drawing Sheets

FIG.2

| BL  | 0 | 1 | 2 | 3 | ... | ... | ... | 60 | 61 | 62 | 63 | 64 | 65 | 66 | 67 | 68 | 69 | 70 | 71 | 72 | 73 | 74 | 75 | 76 | 77 | 78 | 79 |
|---|---|---|---|---|---|---|---|---|---|---|---|---|---|---|---|---|---|---|---|---|---|---|---|---|---|---|---|
| BL0 | 0 | 1 | 2 | 3 | ... | ... | ... | 480 | 488 | 496 | 504 | 512 | 520 | 528 | 536 | 544 | 552 | 560 | 568 | 576 | 584 | 592 | 600 | 608 | 616 | 624 | 632 |
| BL1 | 1 | 8 | 16 | 24 | ... | ... | ... | 481 | 489 | 497 | 505 | 513 | 521 | 529 | 537 | 545 | 553 | 561 | 569 | 577 | 585 | 593 | 601 | 609 | 617 | 625 | 633 |
| BL2 | 2 | 9 | 17 | 25 | ... | ... | ... | 482 | 490 | 498 | 506 | 514 | 522 | 530 | 538 | 546 | 554 | 562 | 570 | 578 | 586 | 594 | 602 | 610 | 618 | 626 | 634 |
| BL3 | 3 | 10 | 18 | 26 | ... | ... | ... | 483 | 491 | 499 | 507 | 515 | 523 | 531 | 539 | 547 | 555 | 563 | 571 | 579 | 587 | 595 | 603 | 611 | 619 | 627 | 635 |
| BL4 | 4 | 11 | 19 | 27 | ... | ... | ... | 484 | 492 | 500 | 508 | 516 | 524 | 532 | 540 | 548 | 556 | 564 | 572 | 580 | 588 | 596 | 604 | 612 | 620 | 628 | 636 |
| BL5 | 5 | 12 | 20 | 28 | ... | ... | ... | 485 | 493 | 501 | 509 | 517 | 525 | 533 | 541 | 549 | 557 | 565 | 573 | 581 | 589 | 597 | 605 | 613 | 621 | 629 | 637 |
| BL6 | 6 | 13 | 21 | 29 | ... | ... | ... | 486 | 494 | 502 | 510 | 518 | 526 | 534 | 542 | 550 | 558 | 566 | 574 | 582 | 590 | 598 | 606 | 614 | 622 | 630 | 638 |
| BL7 | 7 | 14 | 22 | 30 | ... | ... | ... | 487 | 495 | 503 | 511 | 519 | 527 | 535 | 543 | 551 | 559 | 567 | 575 | 583 | 591 | 599 | 607 | 615 | 623 | 631 | 639 |
| PKG | PKG0 | | | | PKG... | | | | PKG15 | | | | PKG16 | | | | PKG17 | | | | PKG18 | | | | PKG19 | | | |
| S | 0 | 1 | 2 | 3 | ... | ... | ... | 60 | 61 | 62 | 63 | 64 | 65 | 66 | 67 | 68 | 69 | 70 | 71 | 72 | 73 | 74 | 75 | 76 | 77 | 78 | 79 |

DATA, 65 Symbols, 520 bit + 1bit | [PARITY, 16 Symbols, 112 bit] + [Poison 15 bit]

MEMORY SYSTEMS INCLUDING MEMORY CONTROLLERS AND MEMORY MODULES AND METHODS OF PROCESSING DATA IN THE MEMORY SYSTEMS

CROSS-REFERENCE TO RELATED APPLICATION

The present application claims priority under 35 U.S.C. 119(a) to Korean Application No. 10-2017-0155180, filed on Nov. 20, 2017, which is incorporated herein by reference in its entirety.

BACKGROUND

1. Technical Field

Various embodiments of the present disclosure generally relate to memory systems, and more particularly, to memory systems including memory controllers and memory modules and methods of processing data in the memory systems.

2. Related Art

Recently, information processing speeds of data management systems have become faster with the improvement in performance of computing systems including multi-core central processing units, large capacity main memory devices, and high performance auxiliary memory devices. However, computing systems have not fully exhibited their highest level of performance because of operations directed to preparing against system crashes, the occurrences of which are unpredictable. Accordingly, nonvolatile dual in-line memory modules (NVDIMMs) corresponding to hybrid memory modules including dynamic random access memory (DRAM) devices and nonvolatile memory (NVM) devices have been proposed to solve the above problems, and various technologies have been studied to improve the performance of computing systems. Each of the NVDIMMs may have a configuration in which an NVM device such as a NAND-type flash memory device or a phase change random access memory (PRAM) device is combined with a memory module including a DRAM device. While DRAM devices lose their stored data when their power supplies are interrupted, NVM devices permanently retain their stored data even when their power supplies are interrupted. Thus, even though power supplies of the NVDIMMs are interrupted, temporary data generated during operations of the NVDIMMs may be safely stored and recovered. That is, each of the NVDIMMs may have both a backup function and a storage function.

In general, an NVDIMM may further include a module controller in addition to the DRAM device and the NVM device. The module controller may include an error correction code (ECC) engine. The ECC engine in the module controller may be generally configured to have an error correction capability which is greater than that of the ECC engine in the memory controller because of a relatively large memory capacity of the NVDIMM. The ECC engine in the module controller of the NVDIMM may perform an ECC encoding operation and an ECC decoding operation exhibiting a superior error correction capability separately from an ECC encoding operation and an ECC decoding operation performed at a host level. While a read operation is performed to read out data stored in a memory device, the ECC encoding operation or the ECC decoding operation may be ordinarily performed in the module controller even in cases for which data to be read corresponds to poison data for which correction is difficult. This may lead to an undesirable increase in read latency.

SUMMARY

In accordance with the teachings of the present disclosure is a memory system including a memory medium configured to store memory data and a media error correction code (ECC) decoder coupled to the memory medium. The media ECC decoder is configured to receive encoded read data from the memory medium, wherein the encoded read data is read from the stored memory data. The media ECC decoder is further configured to decode the encoded read data when the encoded read data is not poison data and a number of erroneous bits for the encoded read data is less than or equal to a threshold value. The media ECC decoder is also configured to skip decoding the encoded read data when the encoded read data is poison data and the number of erroneous bits for the encoded read data is less than or equal to the threshold value.

Also in accordance with accordance with the teachings of the present disclosure is a method, performed by a memory system, for processing data. The method includes receiving, by a media error correction code (ECC) decoder of the memory system, encoded read data read from stored memory data stored in a memory medium of the memory system. The method further includes decoding, by the media ECC decoder, the encoded read data when the encoded read data is not poison data and a number of erroneous bits for the encoded read data is less than or equal to a threshold value. The method also includes skipping decoding, by the media ECC decoder, the encoded read data when the encoded read data is poison data and the number of erroneous bits for the encoded read data is less than or equal to the threshold value.

BRIEF DESCRIPTION OF THE DRAWINGS

Various embodiments of the inventive concept will become more apparent in view of the attached drawings and accompanying detailed description, in which:

FIG. 2 shows a schematic diagram illustrating an example of a memory medium in which ECC encoded data is stored for the memory system of FIG. 1.

DETAILED DESCRIPTION OF THE EMBODIMENTS

Figure 1:
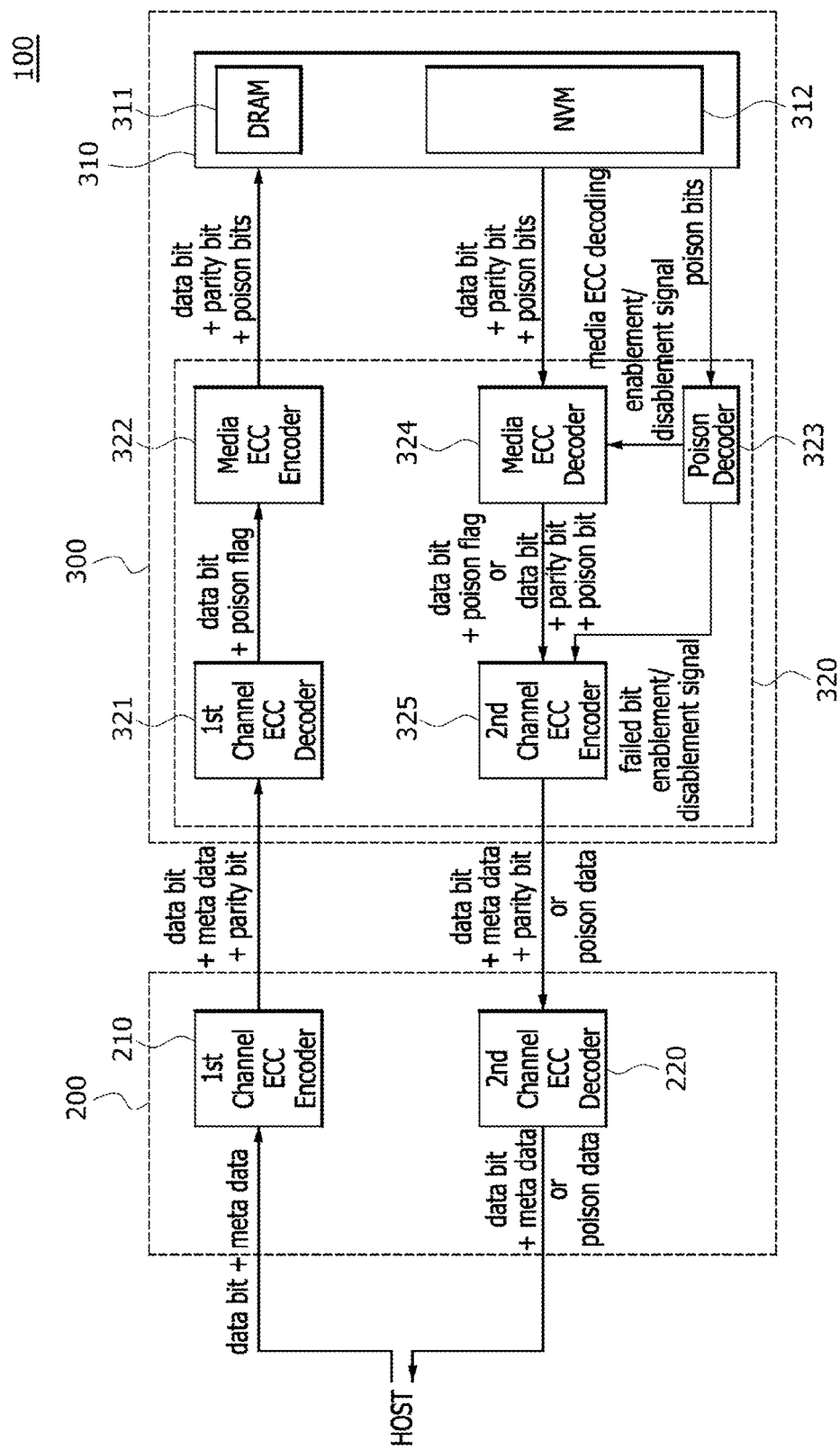
FIG. 1 shows a block diagram illustrating a memory system according to an embodiment of the present disclosure.

In the following description of the embodiments, it will be understood that the terms "first" and "second" are intended to distinguish between similar elements, but are not used to define the element itself or to imply a particular sequence or order. When an element is referred to as being located "on," "over," "above," "under," or "beneath" another element, the intention is to indicate relative position, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to memory systems including memory controllers and memory modules and methods of processing data in the memory systems.

Consistent with the teachings of the present disclosure is a memory system including a memory medium configured to store memory data and a media error correction code (ECC) decoder coupled to the memory medium. The media ECC decoder is configured to receive encoded read data from the memory medium, wherein the encoded read data is read from the stored memory data. The media ECC decoder is further configured to decode the encoded read data when the encoded read data is not poison data and a number of erroneous bits for the encoded read data is less than or equal to a threshold value. The media ECC decoder is also configured to skip decoding the encoded read data when the encoded read data is poison data and the number of erroneous bits for the encoded read data is less than or equal to the threshold value.

For an embodiment, the memory system further includes a media ECC encoder coupled to the memory medium. The media ECC encoder is configured to receive data with an indication that the received data is poison data or is not poison data, encode the received data as encoded write data, send the encoded write data to the memory medium, wherein the encoded write data is written to the memory medium as the stored memory data. In one embodiment, the erroneous bits for the encoded read data result from a combination of errors in writing the encoded write data to the memory medium and reading the encoded read data from the memory medium. In another embodiment, the threshold value is equal to a maximum number of erroneous bits that a combination of an encoding operation by the media ECC encoder and a decoding operation by the media ECC decoder is able to correct.

For an embodiment, the media ECC encoder generates the encoded write data to include a plurality of poison bits. For another embodiment, a number of bits for the plurality of poison bits is set to be one more than twice the maximum number of erroneous bits that the combination of the encoding operation by the media ECC encoder and the decoding operation by the media ECC decoder is able to correct. In a further embodiment, each poison bit of the plurality of poison bits is set to a first logic value when the indication indicates the received data is not poison data or is set to a second logic value when the indication indicates the received data is poison data.

In an embodiment, for each erroneous data bit resulting from a combination of writing the encoded write data to the memory medium and reading the encoded read data from the memory medium, a value of a poison bit of the plurality of poison bits is changed. The bit is changed from the first logic value to the second logic value when the indication indicates the received data is not poison data or the bit is changed from the second logic value to the first logic value when the indication indicates the received data is poison data.

For another embodiment, the memory system further includes a poison decoder circuit coupled between the memory medium and the media ECC decoder. The poison decoder circuit is configured to receive the plurality of poison bits included in the encoded read data read from the memory medium and send a first control signal to the media ECC decoder. The first control signal is a media ECC decoding enablement signal when the encoded read data is not poison data and a number of erroneous bits for the encoded read data is less than or equal to the threshold value. The first control signal is a media ECC decoding disablement signal when the encoded read data is poison data and the number of erroneous bits for the encoded read data is less than or equal to the threshold value.

In one embodiment, the poison decoder circuit includes an adder circuit, wherein the adder circuit is configured to add a total number of poison bits among the plurality of poison bits set to the second logic value to determine an added value and transmit the added value to a comparator circuit. The poison decoder circuit further includes the comparator circuit coupled to the adder circuit, wherein the comparator circuit is configured to compare the added value to the threshold value and transmit a comparison result to a control signal generator circuit. The poison decoder circuit also includes the control signal generator circuit coupled to the comparator circuit, wherein the control signal generator circuit is configured to send the first control signal. The first control signal is a media ECC decoding enablement signal when the encoded read data is not poison data and a number of erroneous bits for the encoded read data is less than or equal to the threshold value. The first control signal is a media ECC decoding disablement signal when the encoded read data is poison data and the number of erroneous bits for the encoded read data is less than or equal to the threshold value.

For another embodiment, the memory system also includes a second channel ECC encoder coupled to the media ECC decoder and coupled to the poison decoder circuit, wherein the control signal generator circuit of the poison decoder circuit is further configured to send a second control signal to the second channel ECC encoder. The second control signal is a failed bit disablement signal when the comparison result indicates the added value is less than or equal to the threshold value, wherein the failed bit disablement signal results in the second channel ECC encoder not adding a failed bit to data the second channel ECC encoder receives from the media ECC decoder and encodes. The second control signal is a failed bit enablement signal when the comparison result indicates the added value is greater than the threshold value, wherein the failed bit enablement signal results in the second channel ECC encoder adding a failed bit to data the second channel ECC encoder receives from the media ECC decoder and encodes.

FIG. 1 shows a block diagram illustrating a memory system 100 according to an embodiment of the present disclosure. The memory system 100 may be configured to include a memory controller 200 and a memory module 300. The memory module 300 may include a memory medium 310 and a module controller 320. The memory controller 200 may be coupled between a host HOST and the memory module 300 to control an operation of the memory module 300. For example, the memory controller 200 may control a write operation that stores write data into a designated location of the memory medium 310 in the memory module 300 in response to a write command outputted from the host HOST. In addition, the memory controller 200 may control a read operation that transmits read data outputted from the memory medium 310 in the memory module 300 to the host HOST in response to a read command outputted from the host HOST.

In order to correct errors occurring during the read operation or the write operation, the memory controller 200 may include a first channel ECC encoder 210 and a second channel ECC decoder 220. The first channel ECC encoder 210 may perform a first channel ECC encoding operation of write data outputted from the host HOST to generate first channel ECC encoded data. The write data outputted from the host HOST may include data bits and meta data. The first channel ECC encoded data may include data bits, meta data, and first parity bits. The second channel ECC decoder 220 may perform a second channel ECC decoding operation of data outputted from the memory module 300 to generate second channel ECC decoded data and may transmit the second channel ECC decoded data to the host HOST. The data outputted from the memory module 300 may include data bits, meta data, and third parity bits or may be poison data including failed bits. The second channel ECC decoded data may include data bits and meta data.

The memory medium 310 of the memory module 300 may be a nonvolatile dual-inline memory module (NVDIMM) including both a DRAM device 311 and an NVM device 312. The NVM device 312 may include a flash memory device, a phase change random access memory (PCRAM) device, a resistive random access memory (ReRAM) device, a ferroelectric random access memory (FeRAM) device, or a magneto-resistance random access memory (MRAM) device. In an embodiment, the NVM device 312 may have a memory capacity which is larger than a memory capacity of the DRAM device 311. In such a case, the memory medium 310 may operate in two modes. One of the two modes may be a mode in which the DRAM device 311 is used as a main memory device and the NVM device 312 is used as a backup memory device. The other of the two modes may be a mode in which the NVM device 312 is used as a main memory device and the DRAM device 311 is used as a buffer memory device.

The module controller 320 may be configured to include a first channel ECC decoder 321, a second channel ECC encoder 325, media ECC engines 322 and 324, and a poison decoder 323. For an embodiment, the poison decoder 323 is a poison decoder circuit. The media ECC engines 322 and 324 may include a media ECC encoder 322 and a media ECC decoder 324. In an embodiment, an error correction capability of the media ECC engines 322 and 324 may be greater than an error correction capability of the first channel ECC encoder 210 and the first channel ECC decoder 321 as well as an error correction capability of the second channel ECC encoder 325 and the second channel ECC decoder 220. In an embodiment, the error correction capability means the maximum number of bits which can be corrected. For example, the maximum number of erroneous bits that a combination of an encoding operation by the media ECC encoder and a decoding operation by the media ECC decoder is able to correct.

The first channel ECC decoder 321 may perform a first channel ECC decoding operation of the first channel ECC encoded data outputted from the first channel ECC encoder 210 to generate first channel ECC decoded data. The first channel ECC decoded data may include data bits and a poison flag. The first channel ECC decoded data including the poison flag is also referred to herein as data with an indication that the data is poison data or is not poison data. For an embodiment, the poison flag may be represented by a single bit. For example, if the bit of the poison flag has a logic "1" level, then the data bits of the first channel ECC decoded data may mean bits of poison data. Poison data, for instance, means corrupt data having errors which are uncorrectable. In contrast, if the bit of the poison flag has a logic "0" level, then the data bits of the first channel ECC decoded data may mean bits of normal data.

The second channel ECC encoder 325 may perform a second channel ECC encoding operation of media ECC decoded data outputted from the media ECC decoder 324 to generate second channel ECC encoded data. The second channel ECC encoded data may be transmitted to the second channel ECC decoder 220 of the memory controller 200. The second channel ECC encoded data may be normal data without any failed bits or poison data including at least one failed bit.

The media ECC encoder 322 may perform a media ECC encoding operation of the first channel ECC decoded data outputted from the first channel ECC decoder 321 to generate media ECC encoded data. The media ECC encoded data may include data bits, second parity bits, and poison bits. The number of the poison bits may be defined as the minimum number among natural numbers that exceeds twice the error correction capability of the media ECC engines 322 and 324. That is, the number of the poison bits may be defined as the minimum number among natural numbers that exceeds twice the maximum number of bits which can be corrected. For example, if the error correction capability of the media ECC engines 322 and 324 is seven, then the poison data may be configured to have fifteen bits. All of the poison bits may have the same value as the poison flag which is inputted to the media ECC encoder 322. For example, if the poison flag has a logic "1" level, then all of the bits included in the poison data may also have a logic "1" level. In contrast, if the poison flag has a logic "0" level, then all of the bits included in the poison data may also have a logic "0" level.

The media ECC decoder 324 may perform, according to a control signal outputted from the poison decoder 323, a media ECC decoding operation of read data outputted from the memory medium 310 to generate the media ECC decoded data or may skip the media ECC decoding operation to output the read data outputted from the memory medium 310 as the media ECC decoded data. The media ECC decoded data may be transmitted to the second channel ECC encoder 325. The read data outputted from the memory medium 310 may include the data bits, the second parity bits, and the poison bits. If the data bits are not the poison data bits but instead are the normal data bits, then the media ECC decoded data generated by the media ECC decoder 324 may include the data bits and the poison flag. In contrast, if the data bits are the poison data bits, then the media ECC decoder 324 may skip the media ECC decoding operation. In such a case, the data outputted from the media ECC decoder 324 may include the same configuration as the read data outputted from the memory medium 310. That is, the data outputted from the media ECC decoder 324 may include the data bits, the second parity bits, and the poison bits.

The poison decoder 323 may receive the poison bits of the read data from the memory medium 310 and output control signals to the media ECC decoder 324 and the second channel ECC encoder 325. The control signal transmitted from the poison decoder 323 to the media ECC decoder 324 may be a media ECC decoding enablement signal, which controls the media ECC decoder 324 such that the media ECC decoding operation is performed by the media ECC decoder 324, or may be a media ECC decoding disablement signal, which controls the media ECC decoder 324 such that the media ECC decoding operation is skipped by the media ECC decoder 324. The control signal transmitted from the poison decoder 323 to the second channel ECC encoder 325 may be a failed bit enablement signal, which controls the second channel ECC encoder 325 such that a failed bit is included in the second channel ECC encoded data, or may be a failed bit disablement signal, which controls the second channel ECC encoder 325 such that no failed bit is included in the second channel ECC encoded data. The control signals outputted from the poison decoder 323 may be determined according to a configuration of the poison bits. In some embodiments, the poison decoder 323 is collocated or integrated with the media ECC decoder 324. In other embodiments, such as for the embodiment pictured, the poison decoder 323 is separate from the media ECC decoder 324. Relationships between the control signals and the poison bits are described in greater detail, infra, with reference to FIGS. 3, 6, 7, 8, and 9.

FIG. 2 shows a schematic view illustrating an example of the memory medium 310 of FIG. 1 in which media ECC encoded data is stored. Referring to FIGS. 1 and 2, memory in the memory medium 310 may include twenty memory packages (i.e., first to twentieth memory packages PKG0-PKG19) for an embodiment. The memory may be configured to include the DRAM device 311 and/or the NVM device 312. Unit cells of each of the memory packages PKG0-PKG19 may be located at cross points of four data lines DQ and eight bit lines BL0-BL7. Thus, each of the memory packages PKG0-PKG19 may store thirty-two bits of data, and the memory in the memory medium 310 may have a chunk size of 640 bits. As described with reference to FIG. 1, the media ECC encoded data outputted from the media ECC encoder 322 may include data bits 410, second parity bits 420, and poison bits.

For the present embodiment, the data bits 410 outputted from the first channel ECC decoder 321 may be configured to include 513 bits, and the data bits 410 may maintain the same configuration even though the media ECC encoding operation of the data bits 410 is performed. The data bits 410 may be stored in unit cells 0 to 511, included in the first to sixteenth memory packages PKG0-PKG15, and in a unit cell 512, included in the seventeenth memory package PKG16. For the present embodiment, the error correction capability of the media ECC engines 322 and 324 is seven. In such a case, the second parity bits 420 may be generated during the media ECC encoding operation performed by the media ECC encoder 322 and may be configured to include 112 bits. The second parity bits 420 may be stored in four memory packages, for example, the seventeenth to twentieth memory packages PKG16-PKG19. Because the error correction capability of the media ECC engines 322 and 324 is seven, poison bits 430 may be configured to have 15 bits including the poison flag.

A first bit among the 15 bits of the poison bits 430 may represent the poison flag outputted from the first channel ECC decoder 321. The first bit of the poison bits 430 may be stored in a unit cell 513 of the seventeenth memory package PKG16, which corresponds to the next bit of the data bits 410. If the media ECC decoding operation is performed, then errors of the data stored in the unit cells 0 to 513 may be corrected during the media ECC decoding operation. Thus, the poison flag corresponding to the first bit of the poison bits 430, which is stored in the unit cell 513, may be protected by the media ECC decoding operation. The data of the remaining fourteen bits of the poison bits 430 may be stored in fourteen redundant unit cells that are left after excluding five hundred and thirteen unit cells used for the storage of the data bits 410, one unit cell used for the storage of the first bit (i.e., the poison flag) of the poison bits 430, and one hundred and twelve unit cells used for the storage of the second parity bits 420 from six hundred and forty unit cells corresponding to the chunk size of the memory medium 310. In order to improve accuracy in discriminating whether the poison data is included in the memory medium 310, the fourteen redundant unit cells storing the poison bits 430 may be uniformly distributed in the seventeenth to twentieth memory packages PKG16-PKG19.

Figure 3:
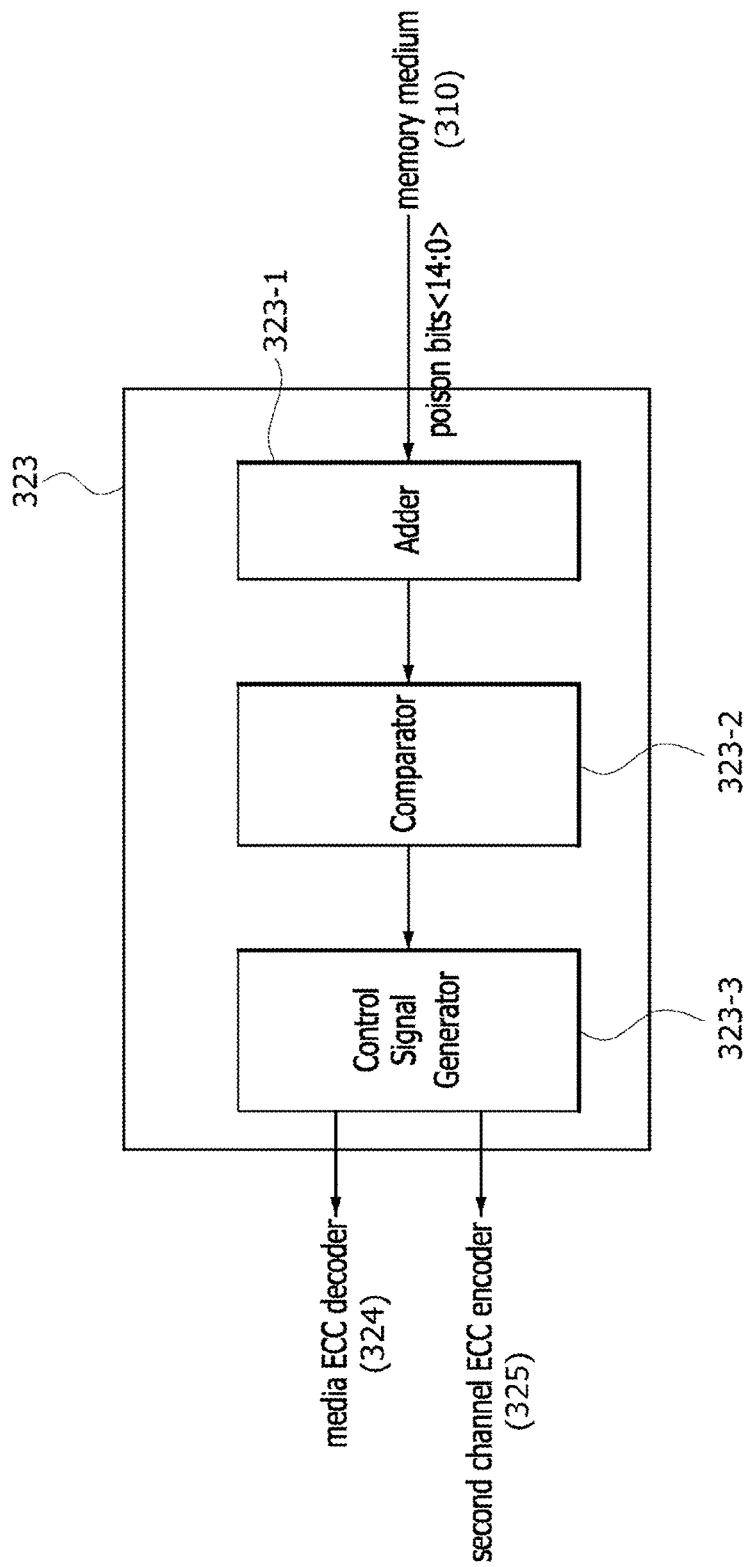
FIG. 3 shows a block diagram illustrating an example of a poison decoder included in the memory system of FIG. 1.

FIG. 3 shows a block diagram illustrating an example of the poison decoder 323 included in the memory system 100 of FIG. 1. Referring to FIG. 3, the poison decoder 323 may be configured to include an adder 323-1, a comparator 323-2, and a control signal generator 323-3. For some embodiments, the adder 323-1, the comparator 323-2, and the control signal generator 323-3 represent an adder circuit, a comparator circuit, and a control signal generator circuit, respectively. The adder 323-1 may add the values of all of the poison bits <14:0> transmitted from the memory medium 310 and may output the added value. The comparator 323-2 may compare an output signal of the adder 323-1 with a reference value and may output a signal having a logic "high" level or a logic "low" level according to the comparison result. In an embodiment, the read data outputted from the memory medium 310 may mean the poison data if an output signal of the comparator 323-2 has a logic "high" level, and the read data outputted from the memory medium 310 may mean the normal data if an output signal of the comparator 323-2 has a logic "low" level. The control signal generator 323-3 may output a first control signal to the media ECC decoder 324 and may output a second control signal to the second channel ECC encoder 325. As described with reference to FIG. 1, the first control signal inputted to the media ECC decoder 324 may be the media ECC decoding enablement signal or the media ECC decoding disablement signal according to an output signal of the comparator 323-2. The second control signal inputted to the second channel ECC encoder 325 may be the failed bit enablement signal or the failed bit disablement signal according to an output signal of the comparator 323-2.

Figure 4:
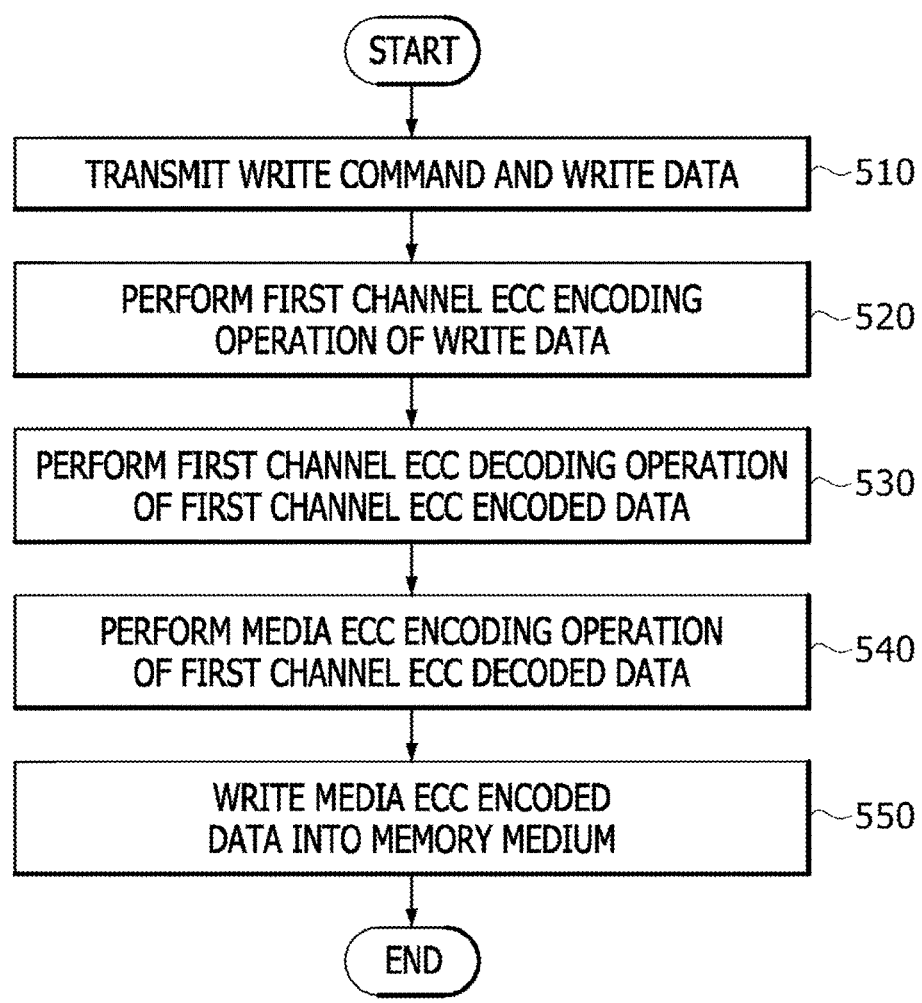
FIG. 4 shows a flowchart illustrating a data write operation in a method for processing data in the memory system of FIG. 1.

FIG. 4 shows a flowchart illustrating a data write operation for a method of processing data in the memory system 100 of FIG. 1. Referring to FIGS. 1 and 4, the host HOST may transmit 510 a write command and write data to the memory controller 200. The first channel ECC encoder 210 of the memory controller 200 may perform 520 a first channel ECC encoding operation of the write data to generate first channel ECC encoded data. First parity bits may be generated by the first channel ECC encoding operation, and the first parity bits may be included in the write data. The first channel ECC encoded data may be transmitted to the first channel ECC decoder 321 in the module controller 320 of the memory module 300. The first channel ECC decoder 321 may perform 530 a first channel ECC decoding operation of the first channel ECC encoded data to generate first channel ECC decoded data. First error correction of the write data may be executed by the first channel ECC decoding operation, and a poison flag may be generated according to the result of the first channel ECC decoding operation. In an embodiment, the poison flag may be generated to have a value of "1" if the write data is poison data, which is uncorrectable after the first channel ECC decoding operation. In contrast, the poison flag may be generated to have a value of "0" if the write data is normal data which is non-erroneous or correctable after the first channel ECC decoding operation.

The media ECC encoder 322 may perform 540 a media ECC encoding operation of the first channel ECC decoded data to generate media ECC encoded data. Second parity bits and poison bits may be generated by the media ECC encoder 322 during the media ECC encoding operation. Because the error correction capability of the media ECC engines 322, 324 is greater than the error correction capability of the first channel ECC engines 210, 321 and the second channel ECC engines 220, 325, the number of the second parity bits may be greater than the number of the first parity bits. The number of the poison bits may be set as the minimum number among natural numbers that exceeds twice the maximum number of bits which can be corrected. For example, when the maximum number of bits which can be corrected are "M", the number of the poison bits are "2M+1". All of the poison bits may have the same value as the poison flag, which is generated by the first channel ECC decoding operation. After the media ECC encoding operation is performed, the media ECC encoded data may be written 550 into the memory medium 310.

Figure 5:
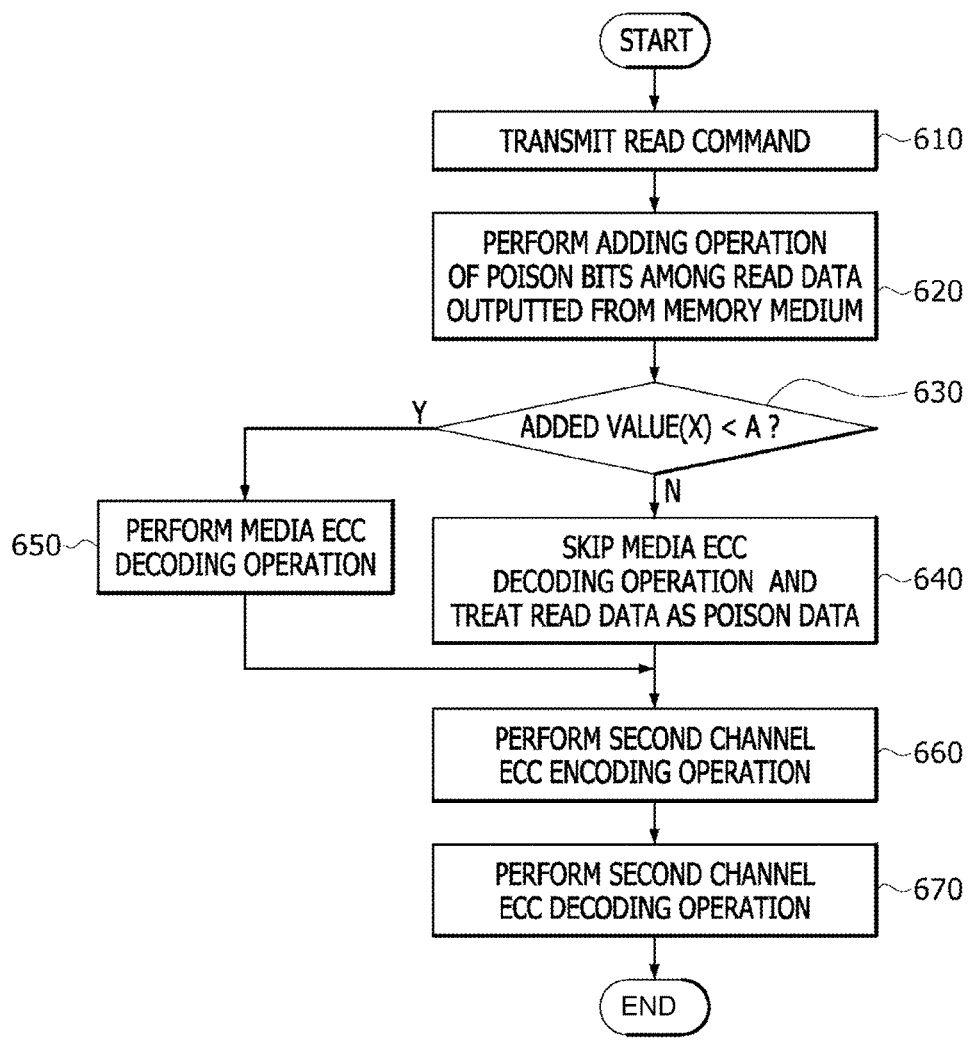
FIG. 5 shows a flowchart illustrating a data read operation in a method for processing data in the memory system of FIG. 1.

FIG. 5 shows a flowchart illustrating a data read operation for a method of processing data in the memory system 100 of FIG. 1. Referring to FIGS. 1, 3, and 5, a read command may be transmitted 610 from the host HOST to the memory controller 200. Read data in the memory medium 310 may be transmitted to the media ECC decoder 324 of the module controller 320 by the memory controller 200 and the module controller 320. In addition, poison bits among the read data may be transmitted to the poison decoder 323. The media ECC decoder 324 may perform a media ECC decoding operation of the read data or may skip the media ECC decoding operation of the read data, according to the first control signal outputted from the poison decoder 323. The adder 323-1 of the poison decoder 323 may perform 620 an adding operation for adding values of all of the poison bits to generate an added value X. The comparator 323-2 of the poison decoder 323 may discriminate 630 whether or not the added value X is less than a predetermined value A. The predetermined value A may be set to the minimum natural number among natural numbers that exceeds the maximum number of bits which can be corrected. For example, when the maximum number of bits which can be corrected are "M", the predetermined value A is set to "M+1". The control signal generator 323-3 of the poison decoder 323 may generate the first control signal and the second control signal in response to an output signal of the comparator 323-2.

If the added value X is determined 630 to be equal to or greater than the predetermined value A, then the media ECC decoder 324 may skip 640 the media ECC decoding operation of the read data and the read data may be treated as poison data. Specifically, if the added value X is equal to or greater than the predetermined value A, then the control signal generator 323-3 may output the media ECC decoding disablement signal as the first control signal and may transmit the first control signal to the media ECC decoder 324. In addition, the control signal generator 323-3 may output the failed bit enablement signal as the second control signal and may transmit the second control signal to the second channel ECC encoder 325. The media ECC decoder 324 may receive the first control signal (i.e., the media ECC decoding disablement signal), responsively skip the media ECC decoding operation, and transmit the read data outputted from the memory medium 310 to the second channel ECC encoder 325. Accordingly, access time for reading out the data stored in the memory medium 310 may be reduced by skipping 640 the media ECC decoding operation. The second channel ECC encoder 325 receiving the second control signal (i.e., the failed bit enablement signal) may perform 660 the second channel ECC encoding operation of the read data to generate second channel ECC encoded data. In such a case, the second channel ECC encoder 325 may add a failed bit to the second channel ECC encoded data. The second channel ECC encoded data including the failed bit may be decoded 670 by the second channel ECC decoder 220, and the second channel ECC decoded data may be transmitted to the host HOST.

If the added value X is determined 630 to be less than the predetermined value A, then the control signal generator 323-3 may output the media ECC decoding enablement signal as the first control signal and may transmit the first control signal to the media ECC decoder 324. In addition, the control signal generator 323-3 may output the failed bit disablement signal as the second control signal and may transmit the second control signal to the second channel ECC encoder 325. The media ECC decoder 324 receiving the first control signal (i.e., the media ECC decoding enablement signal) may perform 650 the media ECC decoding operation to generate media ECC decoded data. The second channel ECC encoder 325 may perform 660 the second channel ECC encoding operation of the media ECC decoded data to generate the second channel ECC encoded data. In such a case, the second channel ECC encoder 325 does not add a failed bit to the second channel ECC encoded data. The second channel ECC encoded data without the failed bit may be decoded by the second channel ECC decoder 220 (see the step 670), and the second channel ECC decoded data may be transmitted to the host HOST.

For some embodiments, the comparator 323-2 of the poison decoder 323 may discriminate 630 whether or not the added value X is less than or equal to a threshold value or is greater than the threshold value, wherein the threshold value is equal to a maximum number of erroneous bits that a combination of an encoding operation by the media ECC encoder and a decoding operation by the media ECC decoder is able to correct. For example, the threshold value is one less than the predetermined value A. As a result, the added value X being less than the predetermined value A is equivalent to the added value X being less than or equal to the threshold value, and the added value X being greater than or equal to the predetermined value A is equivalent to the added value X being greater than the threshold value.

Figure 6:
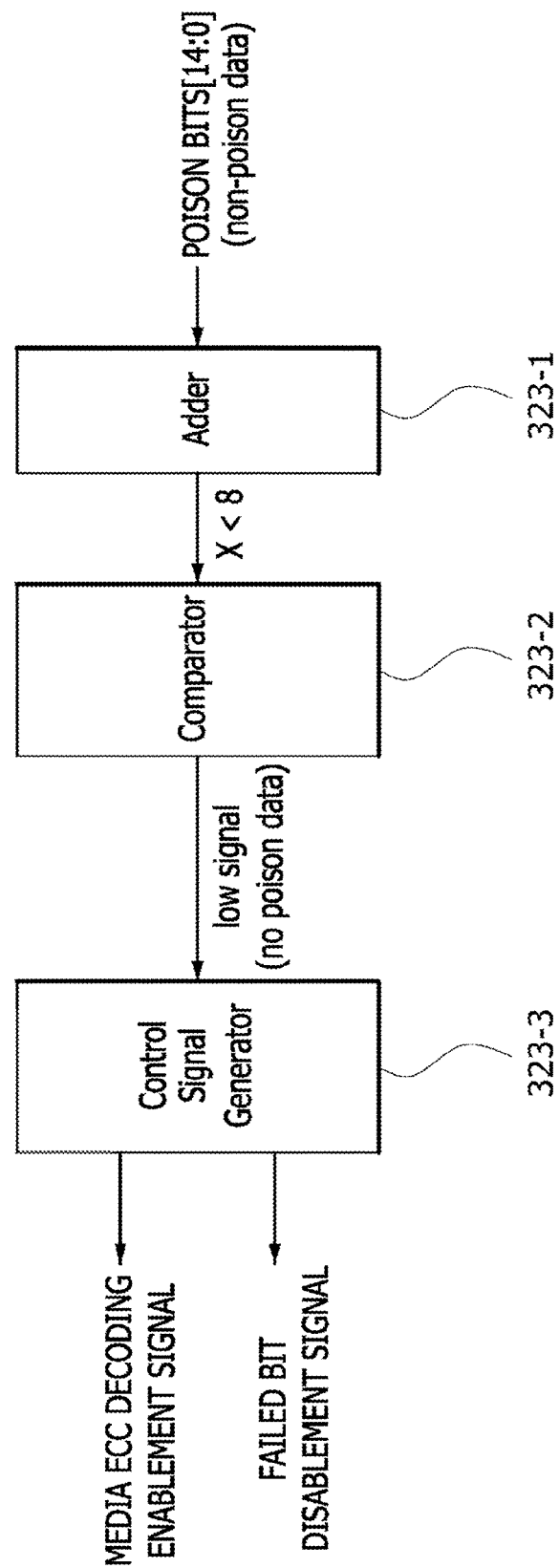
FIGS. 6, 7, 8, and 9 show block diagrams illustrating various operations performed, while the data read operation of FIG. 5 is performed, by a poison decoder of a module controller included in the memory system of FIG. 1.
Figure 7:
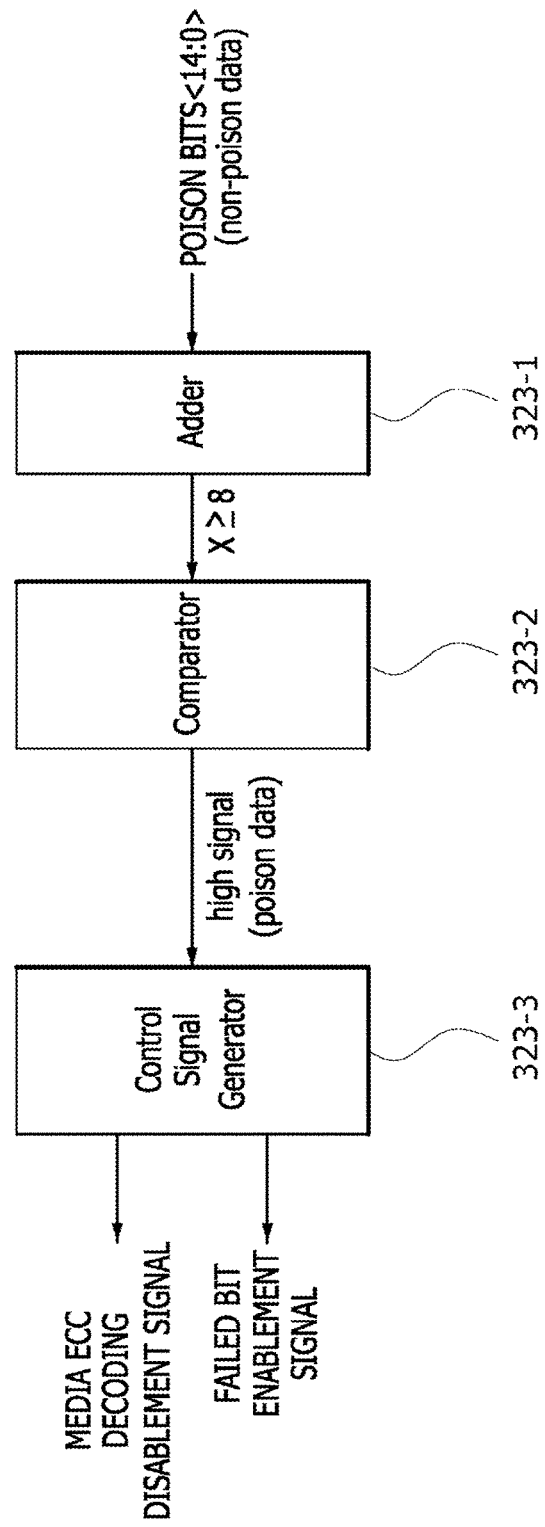

FIGS. 6 to 9 show block diagrams illustrating various operations performed by the poison decoder 323 of the memory system 100 of FIG. 1 while the data read operation of FIG. 5 is performed. For presented embodiments, it is assumed that the error correction capability of the media ECC engines 322 and 324 (i.e., the maximum number of bits which can be corrected by the media ECC engines 322 and 324, which is also the threshold value) is seven and the poison bits are configured to have fifteen bits. In such a case, the predetermined value A, used in discriminating between the presence and absence of the poison data, may be set to be eight, which is equivalent to a threshold value of seven. FIGS. 6 and 7 illustrate examples in which the poison flag has a first logic value of "0" during the write operation for storing the write data in the memory medium 310, and the poison bits are configured to provide a binary stream including fifteen bits of "000000000000000." This means that the read data is normal data. In particular, FIG. 6 illustrates an example in which the added value X outputted from the adder 323-1 of the poison decoder 323 is less than the predetermined value of eight (or less than or equal to the threshold value of 7), and FIG. 7 illustrates an example in which the added value X outputted from the adder 323-1 of the poison decoder 323 is equal to or greater than the predetermined value of eight (or greater than the threshold value of 7).

Figure 8:
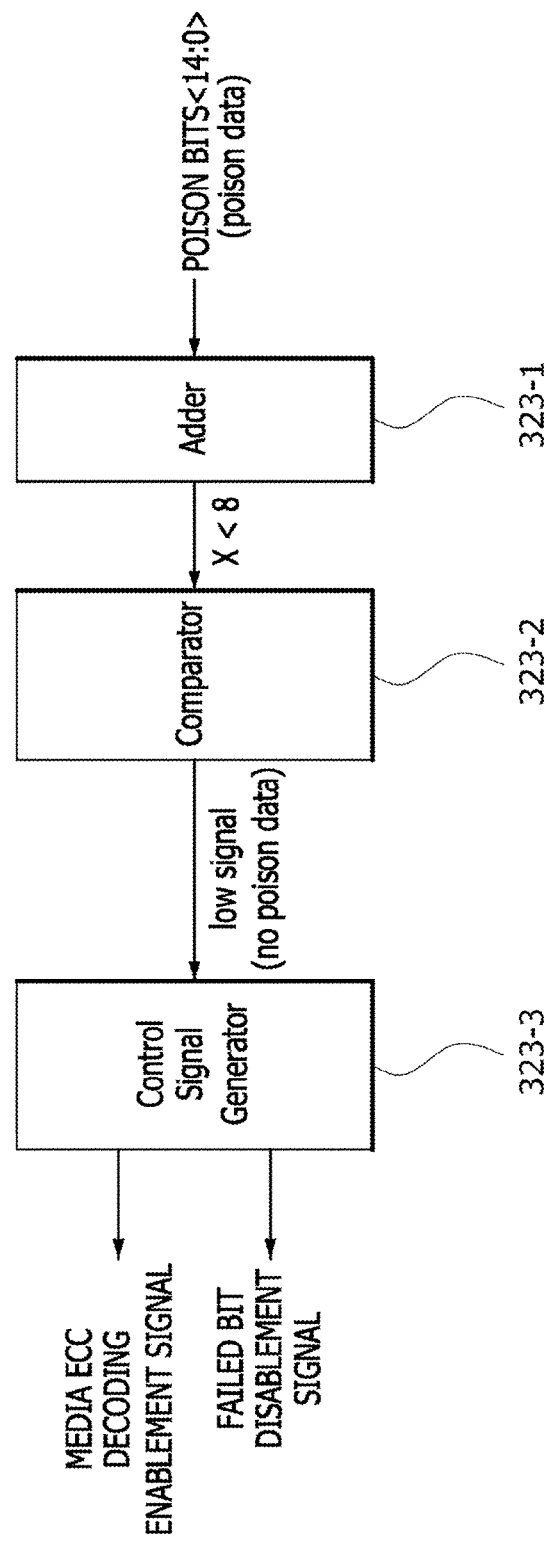
Figure 9:
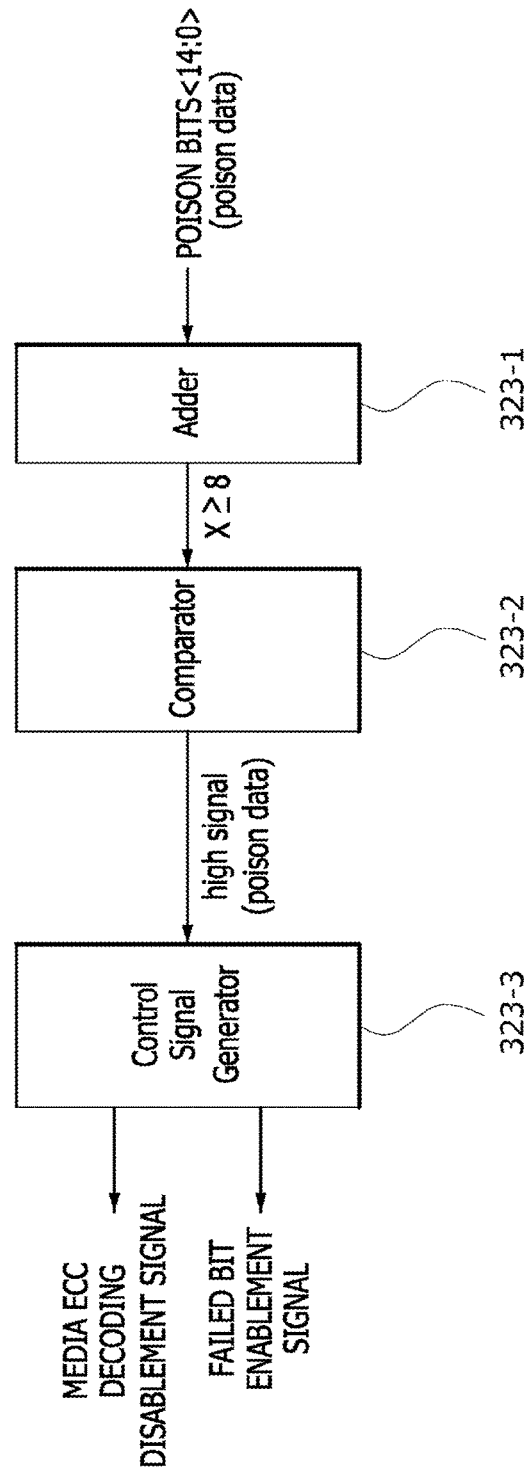

In contrast to FIGS. 6 and 7, FIGS. 8 and 9 illustrate examples in which the poison flag has a second logic value of "1" during the write operation for storing the write data in the memory medium 310, and the poison bits are configured to provide a binary stream including fifteen bits of "111111111111111." This means that the read data is poison data. In particular, FIG. 8 illustrates an example in which the added value X outputted from the adder 323-1 of the poison decoder 323 is less than the predetermined value of eight (or less than or equal to the threshold value of seven), and FIG. 9 illustrates an example in which the added value X outputted from the adder 323-1 of the poison decoder 323 is equal to or greater than the predetermined value of eight (or greater than the threshold value of seven).

First, as illustrated in FIG. 6, in the event that the poison bits are configured to have a fifteen-bit binary stream of "000000000000000," the comparator 323-2 may output a signal having a logic "low" level indicating that the read data is not poison data but normal data if the added value X outputted from the adder 323-1 is less than the predetermined value of eight (or less than or equal to the threshold value of 7). In an embodiment, if no error is generated during the write operation or the read operation applied to the memory medium 310, then the added value X outputted from the adder 323-1 may have a value (i.e., zero) less than eight since all of the poison bits have a value of zero. In another embodiment, if seven or less erroneous bits are generated during the write operation or the read operation applied to the memory medium 310, then the added value X outputted from the adder 323-1 may have a value less than eight since at most seven bits among the poison bits have a value of one and at least the other eight bits among the poison bits have a value of zero. For example, if the poison bits have a binary stream of "010101010100011" during the read operation, then the added value X outputted from the adder 323-1 may have a value of seven. In such a case, if seven or less erroneous bits are generated, all of the erroneous bits can be corrected because the error correction capability of the media ECC engines 322, 324 is seven. Thus, the read data may be treated as normal data. The control signal generator 323-3 may receive the output signal (having a logic "low" level) of the comparator 323-2 and generate a media ECC decoding enablement signal as a first control signal and a failed bit disablement signal as a second control signal so that the media ECC decoder (324 of FIG. 1) normally performs the media ECC decoding operation.

Next, as illustrated in FIG. 7, in the event that the poison bits are configured to have a fifteen-bit binary stream of "000000000000000," the comparator 323-2 may output a signal having a logic "high" level indicating that the read data is poison data if the added value X outputted from the adder 323-1 is equal to or greater than the predetermined value of eight (or greater than the threshold value of seven). In an embodiment, if at least eight erroneous bits are generated during the write operation or the read operation applied to the memory medium 310, then the added value X outputted from the adder 323-1 may have a value which is equal to or greater than eight. For example, if eight erroneous bits are generated during the write operation or the read operation applied to the memory medium 310 and the poison bits have a binary stream of "010101010101011," then the added value X outputted from the adder 323-1 may have a value of eight. In such a case, the read data may be originally be normal data, but the erroneous bits cannot be corrected because the number of the erroneous bits is greater than seven, where seven corresponds to the error correction capability of the media ECC engines 322, 324. Accordingly, the read data may be treated as poison data, and the media ECC decoding operation may be skipped. The control signal generator 323-3 may receive the output signal (having a logic "high" level) of the comparator 323-2 and generate a media ECC decoding disablement signal as the first control signal and a failed bit enablement signal as the second control signal so that the media ECC decoding operation is skipped by the media ECC decoder (324 of FIG. 1).

Next, as illustrated in FIG. 8, in the event that the poison bits are configured to have a fifteen-bit binary stream of "111111111111111," the comparator 323-2 may output a signal having a logic "low" level indicating that the read data is not poison data but normal data if the added value X outputted from the adder 323-1 is less than the predetermined value of eight (or less than or equal to the threshold value of seven). The control signal generator 323-3 may receive the output signal (having a logic "low" level) of the comparator 323-2 and generate a media ECC decoding enablement signal as the first control signal and a failed bit disablement signal as the second control signal so that the media ECC decoder (324 of FIG. 1) normally performs the media ECC decoding operation. In an embodiment, if at least eight erroneous bits are generated during the write operation or the read operation applied to the memory medium 310, then the added value X outputted from the adder 323-1 may have a value which is less than eight. For example, if eight erroneous bits are generated during the write operation or the read operation applied to the memory medium 310 and the poison bits have a binary stream of "110100010000111" during the read operation, then the added value X outputted from the adder 323-1 may have a value of seven, which is less than eight. In such a case, the erroneous bits cannot be corrected because the number of erroneous bits generated during the write operation or the read operation is greater than seven, which corresponds to the error correction capability of the media ECC engines 322, 324. Thus, even though the read data is treated as normal data and the media ECC decoding operation is performed, the erroneous bits cannot be corrected during the media ECC decoding operation.

Next, as illustrated in FIG. 9, in the event that the poison bits are configured to have a fifteen-bit binary stream of "111111111111111," the comparator 323-2 may output a signal having a logic "high" level indicating that the read data is poison data if the added value X outputted from the adder 323-1 is equal to or greater than the predetermined value of eight (or greater than the threshold value of seven). In an embodiment, if no erroneous bit is generated during the write operation or the read operation applied to the memory medium 310, then the added value X outputted from the adder 323-1 may have a value (i.e., fifteen) which is equal to or greater than eight since all of the poison bits have a value of one. In another embodiment, if seven or less erroneous bits are generated during the write operation or the read operation applied to the memory medium 310, then the added value X outputted from the adder 323-1 may have a value equal to or greater than eight because at most seven bits among the poison bits have a value of zero and at least the other eight bits among the poison bits have a value of one. For example, if seven erroneous bits are generated during the write operation or the read operation and the poison bits have a binary stream of "110101010100011," then the added value X outputted from the adder 323-1 may have a value of eight. The control signal generator 323-3 may receive the output signal (having a logic "high" level) of the comparator 323-2 and generate the media ECC decoding disablement signal as the first control signal and a failed bit enablement signal as the second control signal so that the media ECC decoding operation is skipped by the media ECC decoder (324 of FIG. 1).

As described above, in the event that all of the poison bits are configured to have a value of zero and the read data is normal data, a media ECC decoding operation may be normally performed if the number of erroneous bits among the poison bits is less than an error correction capability of media ECC engines. However, even though all of the poison bits are configured to have a value of zero and the read data is normal data, the read data may be treated as poison data to skip the media ECC decoding operation if the number of the erroneous bits is equal to or greater than the error correction capability of the media ECC engines. This is because the erroneous bits cannot be corrected even though the media ECC decoding operation is performed.

In the event that all of the poison bits are configured to have a value of one and the read data is poison data, the media ECC decoding operation may be normally performed if the number of erroneous bits among the poison bits is less than the error correction capability of the media ECC engines. However, in such case, even though the media ECC decoding operation is performed, the erroneous bits cannot be corrected. Thus, the poison data may be treated as corrupted data. In the event that all of the poison bits are configured to have a value of one and the read data is poison data, the media ECC decoding operation may be skipped if the number of erroneous bits among the poison bits is less than the error correction capability of the media ECC engines. As a result, a read latency of a memory module outputting the read data may be reduced.

Embodiments for the present teachings have been disclosed, supra, for illustrative purposes. Those of ordinary skill in the art will appreciate that various modifications, additions, and substitutions are possible for the disclosed embodiments without departing from the scope and spirit of the present teachings as set forth in the accompanying claims.

What is claimed is:

1. A memory system comprising:
   a memory medium configured to store memory data; and
   a media error correction code (ECC) decoder coupled to the memory medium, wherein the media ECC decoder is configured to:
   receive encoded read data from the memory medium, wherein the encoded read data is read from the stored memory data;
   decode the encoded read data when the encoded read data is not poison data and a number of erroneous bits for the encoded read data is less than or equal to a threshold value; and
   skip decoding the encoded read data when the encoded read data is poison data and the number of erroneous bits for the encoded read data is less than or equal to the threshold value.

2. The memory system of claim 1 further comprising a media ECC encoder coupled to the memory medium, wherein the media ECC encoder is configured to:
   receive data with an indication that the received data is poison data or is not poison data;
   encode the received data as encoded write data; and
   send the encoded write data to the memory medium, wherein the encoded write data is written to the memory medium as the stored memory data.

3. The memory system of claim 2, wherein the erroneous bits for the encoded read data result from a combination of errors in writing the encoded write data to the memory medium and reading the encoded read data from the memory medium.

4. The memory system of claim 2, wherein the threshold value is equal to a maximum number of erroneous bits that a combination of an encoding operation by the media ECC encoder and a decoding operation by the media ECC decoder is able to correct.

5. The memory system of claim 4, wherein the media ECC encoder generates the encoded write data to include a plurality of poison bits.

6. The memory system of claim 5, wherein a number of bits for the plurality of poison bits is set to be one more than twice the maximum number of erroneous bits that the combination of the encoding operation by the media ECC encoder and the decoding operation by the media ECC decoder is able to correct.

7. The memory system of claim 6, wherein each poison bit of the plurality of poison bits is set to:
   a first logic value when the indication indicates the received data is not poison data; or
   a second logic value when the indication indicates the received data is poison data.

8. The memory system of claim 7, wherein for each erroneous data bit resulting from a combination of writing the encoded write data to the memory medium and reading the encoded read data from the memory medium, a value of a poison bit of the plurality of poison bits is changed:
   from the first logic value to the second logic value when the indication indicates the received data is not poison data; or
   from the second logic value to the first logic value when the indication indicates the received data is poison data.

9. The memory system of claim 8 further comprising a poison decoder circuit coupled between the memory medium and the media ECC decoder, wherein the poison decoder circuit is configured to:
   receive the plurality of poison bits included in the encoded read data read from the memory medium; and
   send a first control signal to the media ECC decoder, wherein the first control signal comprises:
   a media ECC decoding enablement signal when the encoded read data is not poison data and a number of erroneous bits for the encoded read data is less than or equal to the threshold value; and
   a media ECC decoding disablement signal when the encoded read data is poison data and the number of erroneous bits for the encoded read data is less than or equal to the threshold value.

10. The memory system of claim 9, wherein the poison decoder circuit comprises:
   an adder circuit, wherein the adder circuit is configured to add a total number of poison bits among the plurality of poison bits set to the second logic value to determine an added value and transmit the added value to a comparator circuit;
   the comparator circuit coupled to the adder circuit, wherein the comparator circuit is configured to compare the added value to the threshold value and transmit a comparison result to a control signal generator circuit; and the control signal generator circuit coupled to the comparator circuit, wherein the control signal generator circuit is configured to send the first control signal, wherein the first control signal comprises:

the media ECC decoding enablement signal when the comparison result indicates the added value is less than or equal to the threshold value; or the media ECC decoding disablement signal when the comparison result indicates the added value is greater than the threshold value.

11. The memory system of claim 10 further comprising a second channel ECC encoder coupled to the media ECC decoder and coupled to the poison decoder circuit, wherein the control signal generator circuit of the poison decoder circuit is further configured to send a second control signal to the second channel ECC encoder, wherein the second control signal comprises:

a failed bit disablement signal when the comparison result indicates the added value is less than or equal to the threshold value, wherein the failed bit disablement signal results in the second channel ECC encoder not adding a failed bit to data the second channel ECC encoder receives from the media ECC decoder and encodes; or a failed bit enablement signal when the comparison result indicates the added value is greater than the threshold value, wherein the failed bit enablement signal results in the second channel ECC encoder adding a failed bit to data the second channel ECC encoder receives from the media ECC decoder and encodes.

12. A method performed by a memory system for processing data, the method comprising:

receiving, by a media error correction code (ECC) decoder of the memory system, encoded read data read from stored memory data stored in a memory medium of the memory system;

decoding, by the media ECC decoder, the encoded read data when the encoded read data is not poison data and a number of erroneous bits for the encoded read data is less than or equal to a threshold value; and skipping decoding, by the media ECC decoder, the encoded read data when the encoded read data is poison data and the number of erroneous bits for the encoded read data is less than or equal to the threshold value.

13. The method of claim 12 further comprising:

receiving, by a media ECC encoder of the memory system, data with an indication that the received data is poison data or is not poison data;

encoding, by the media ECC encoder, the received data as encoded write data; and sending, by the media ECC encoder, the encoded write data to the memory medium, wherein the encoded write data is written to the memory medium as the stored memory data.

14. The method of claim 13, wherein the erroneous bits for the encoded read data result from a combination of errors in writing the encoded write data to the memory medium and reading the encoded read data from the memory medium.

15. The method of claim 13, wherein the threshold value is equal to a maximum number of erroneous bits that a combination of an encoding operation by the media ECC encoder and a decoding operation by the media ECC decoder is able to correct.

16. The method of claim 15 further comprising generating, by the media ECC encoder, the encoded write data to include a plurality of poison bits.

17. The method of claim 16 further comprising setting, the media ECC encoder, a number of bits for the plurality of poison bits to be one more than twice the maximum number of erroneous bits that the combination of the encoding operation by the media ECC encoder and the decoding operation by the media ECC decoder is able to correct.

18. The method of claim 17 further comprising setting, by the media ECC encoder, each poison bit of the plurality of poison bits to:

a first logic value when the indication indicates the received data is not poison data; or a second logic value when the indication indicates the received data is poison data.

19. The method of claim 18 further comprising changing, for each erroneous data bit resulting from a combination of writing the encoded write data to the memory medium and reading the encoded read data from the memory medium, a value of a poison bit of the plurality of poison bits:

from the first logic value to the second logic value when the indication indicates the received data is not poison data; or from the second logic value to the first logic value when the indication indicates the received data is poison data.

20. The method of claim 19 further comprising:

receiving, by a poison decoder circuit coupled between the memory medium and the media ECC decoder of the memory system, the plurality of poison bits included in the encoded read data read from the memory medium; and sending, by the poison decoder circuit, a first control signal to the media ECC decoder, wherein the first control signal comprises:

a media ECC decoding enablement signal when the encoded read data is not poison data and a number of erroneous bits for the encoded read data is less than or equal to the threshold value; and a media ECC decoding disablement signal when the encoded read data is poison data and the number of erroneous bits for the encoded read data is less than or equal to the threshold value.

21. The method of claim 20 further comprising:

adding, by an adder circuit of the poison decoder circuit, a total number of poison bits among the plurality of poison bits set to the second logic value to determine an added value and transmitting the added value to a comparator circuit of the poison decoder circuit;

comparing, by the comparator circuit, the added value to the threshold value and transmitting a comparison result to a control signal generator circuit of the poison decoder circuit; and sending, by the control signal generator circuit, the first control signal, wherein the first control signal comprises:

the media ECC decoding enablement signal when the comparison result indicates the added value is less than or equal to the threshold value; or the media ECC decoding disablement signal when the comparison result indicates the added value is greater than the threshold value.

22. The method of claim 21 further comprising sending, by the control signal generator circuit, a second control signal to a second channel ECC encoder coupled to the media ECC controller, wherein the second control signal comprises:

a failed bit disablement signal when the comparison result indicates the added value is less than or equal to the threshold value, wherein the failed bit disablement signal results in the second channel ECC encoder not adding a failed bit to data the second channel ECC encoder receives from the media ECC decoder and encodes; or a failed bit enablement signal when the comparison result indicates the added value is greater than the threshold value, wherein the failed bit enablement signal results in the second channel ECC encoder adding a failed bit to data the second channel ECC encoder receives from the media ECC decoder and encodes.

23. A memory system comprising:
a memory controller coupled between a host and a memory module, wherein the memory controller is configured to control an operation of the memory module; and
the memory module including a memory medium and a module controller, wherein the module controller comprises:
  a media error correction code (ECC) encoder configured to generate media ECC encoded data including write poison data comprised of a plurality of poison bits from first channel ECC encoded data generated by the memory controller and configured to transmit the media ECC encoded data to the memory medium;
  a poison decoder configured to analyze read poison data included in read data outputted from the memory medium and configured to discriminate whether the read poison data is identical to the write poison data to generate a control signal; and
  a media ECC decoder configured to perform or skip a media ECC decoding operation of the read data according to the control signal outputted from the poison decoder.

24. The memory system of claim 23, wherein the memory medium includes a dynamic random access memory (DRAM) device and a nonvolatile memory device.

25. The memory system of claim 23, wherein the memory controller includes:
  a first channel ECC encoder configured to perform a first channel ECC encoding operation of write data outputted from the host to generate the first channel ECC encoded data; and
  a second channel ECC decoder configured to perform a second channel ECC decoding operation of second channel ECC encoded data outputted from the memory module to generate second channel ECC decoded data.

26. The memory system of claim 25, wherein the first channel ECC encoded data outputted from the first channel ECC encoder include data bits and first parity bits.

27. The memory system of claim 26, wherein the module controller further includes:
  a first channel ECC decoder configured to perform a first channel ECC decoding operation of the first channel ECC encoded data to generate first channel ECC decoded data and configured to transmit the first channel ECC decoded data to the media ECC encoder; and
  a second channel ECC decoder configured to perform a second channel ECC decoding operation of media ECC decoded data outputted from the media ECC decoder to generate the second channel ECC decoded data and configured to transmit the second channel ECC decoded data to the second channel ECC decoder of the memory controller.

28. The memory system of claim 27, wherein the first channel ECC decoded data includes the data bits and a poison flag having a single bit.

29. The memory system of claim 28, wherein the media ECC encoded data generated by the media ECC encoder include the data bits, second parity bits, and poison bits constituting the write poison data.

30. The memory system of claim 29, wherein the number of the second parity bits is greater than the number of the first parity bits.

31. The memory system of claim 29, wherein the number of the poison bits is set to be a sum of one and twice the maximum number of erroneous bits which are able to be corrected by the media ECC encoder and the media ECC decoder.

32. The memory system of claim 29, wherein all of the poison bits have the same value as the poison flag.

33. The memory system of claim 29, wherein the poison decoder includes:
  an adder configured to add values of all of the poison bits included in the read data outputted from the memory medium to output the added value;
  a comparator configured to compare the added value outputted from the adder with a predetermined value to output a comparison signal; and
  a control signal generator configured to generate the control signal according to the comparison signal outputted from the comparator,
  wherein the control signal includes a first control signal and a second control signal.

34. The memory system of claim 33, wherein the predetermined value is set to be the minimum natural number that exceeds the maximum number of bits which are able to be corrected by the media ECC encoder and the media ECC decoder.

35. The memory system of claim 34,
wherein the comparison signal outputted from the comparator has a first logic level indicating that the read data are normal data if the added value is less than the predetermined value; and
wherein the comparison signal outputted from the comparator has a second logic level indicating that the read data are poison data if the added value is equal to or greater than the predetermined value.

36. The memory system of claim 34,
wherein the control signal generator generates a media ECC decoding enablement signal as the first control signal if the comparison signal outputted from the comparator has the first logic level, and the media ECC decoding enablement signal is transmitted to the media ECC decoder so that the media ECC decoder performs the media ECC decoding operation; and
wherein the control signal generator generates a media ECC decoding disablement signal as the first control signal if the comparison signal outputted from the comparator has the second logic level, and the media ECC decoding disablement signal is transmitted to the media ECC decoder so that the media ECC decoder skips the media ECC decoding operation.

37. The memory system of claim 36,
wherein the poison decoder generates a failed bit enablement signal as the second control signal if the comparison signal outputted from the comparator has the first logic level, and the failed bit enablement signal is transmitted to the second channel ECC encoder to add a failed bit to the second channel ECC encoded data; and wherein the poison decoder generates a failed bit disablement signal as the second control signal if the comparison signal outputted from the comparator has the second logic level, and the failed bit disablement signal is transmitted to the second channel ECC encoder so that no failed bit is added to the second channel ECC encoded data.

\* \* \* \* \*